United States Patent [19]

Craig

[11] Patent Number: 4,679,112
[45] Date of Patent: Jul. 7, 1987

[54] TRANSISTOR PROTECTION CIRCUIT FOR AUTOMOTIVE MOTOR CONTROL APPLICATIONS

[75] Inventor: Gale M. Craig, Anderson, Ind.

[73] Assignee: General Motors Corporation, Detroit, Mich.

[21] Appl. No.: 891,011

[22] Filed: Jul. 31, 1986

[51] Int. Cl.[4] .................... H02H 7/09; H02H 3/18
[52] U.S. Cl. .................... 361/33; 361/84; 361/91; 361/111; 322/28; 318/430; 318/459
[58] Field of Search .................... 361/33, 28, 58, 86, 361/92, 111, 84, 77, 146, 152; 318/430, 434, 459, 331; 307/9, 10 R; 322/28

[56] References Cited

U.S. PATENT DOCUMENTS

| | | | |
|---|---|---|---|
| 3,440,506 | 4/1969 | Krestel et al. | 318/254 |
| 3,641,407 | 2/1972 | Scott | 361/84 |
| 3,719,876 | 3/1973 | Miller | 318/341 |
| 3,878,446 | 4/1975 | Brandt | 318/317 |
| 4,028,737 | 6/1977 | Bailey | 361/86 |
| 4,057,844 | 11/1977 | Smedley | 361/111 |
| 4,178,619 | 12/1979 | Seiler et al. | 361/111 X |
| 4,218,730 | 8/1980 | Marumoto et al. | 363/124 |
| 4,274,036 | 6/1981 | Fukasaku et al. | 318/331 |
| 4,286,205 | 8/1981 | Watrous | 322/28 X |
| 4,300,508 | 11/1981 | Streit et al. | 123/490 |
| 4,495,536 | 1/1985 | Bynum | 361/91 |
| 4,511,829 | 8/1985 | Wisniewski | 318/317 |
| 4,565,951 | 1/1986 | Petit | 318/317 |
| 4,580,063 | 4/1986 | Torelli et al. | 307/200 B |

Primary Examiner—A. D. Pellinen
Assistant Examiner—Todd E. DeBoer
Attorney, Agent, or Firm—Mark A. Navarre

[57] ABSTRACT

A protection circuit for the power transistor of an automotive motor control circuit. The protection circuit comprises a protection transistor, a resistor, and a Zener diode. The emitter-collector circuit of the protection transistor is connected in series with the resistor across the primary conduction path of the power transistor, with the resistor connected across the conduction control terminals of the power transistor. The Zener diode is connected in series with the emitter-base circuit of the protection transistor across the motor, with the Zener diode poled to oppose current flow through the emitter-base circuit. Transient inductive voltage generated across the motor upon removal of an externally applied control signal exceeds the reverse breakdown threshold of the Zener diode and biases the protection transistor conductive. The protection transistor, in turn, directs current through the resistor to develop a bias voltage which biases the power transistor into a partially conductive state for slowly dissipating the inductive transient. Source voltage transients due to load dump conditions are ineffective to bias the power transistor conductive.

4 Claims, 3 Drawing Figures

TRANSISTOR PROTECTION CIRCUIT FOR AUTOMOTIVE MOTOR CONTROL APPLICATIONS

This invention relates to transistor protection circuits and more particularly to a protection circuit for switching power transistors in automotive motor control applications.

When a transistor is used to control the application of a DC source such as a battery to a DC motor, it is generally desirable to bias the transistor fully conductive or nonconductive in order to limit power dissipation therein. However, the motor windings are an inductive load, and a relatively high peak transient voltage is generated across the motor when the transistor is biased from a conductive state to a nonconductive state. The magnitude of the transient voltage $V_L$ can be considerable, and is generally given according to the expression:

$$V_L = L * di_L/dt$$

where L is the inductance of the motor windings, and $di_L/dt$ is the rate of change in current $i_L$ therethrough. Either the transistor must be sized to withstand the turnoff transient, or a protection circuit must be used to limit the transient voltage $V_L$.

In one type of protection circuit, the transient voltage $V_L$ at turnoff is limited by maintaining the transistor in a partially conductive state. A generally effective circuit of this type is depicted in FIG. 1 in the environment of an automotive motor control application.

Referring to FIG. 1, the environment comprises an automotive storage battery 10, a DC motor 12, a power transistor 14, and a generator 16. The DC motor 12 may be used for controlling an automotive load, such as a movable headlamp cover. The generator 16 is driven by the vehicle engine, and includes a voltage regulator (not shown) responsive to the voltage across battery 10 for controlling the generator output voltage so as to maintain battery 10 in a charged condition.

A motor controller 18 selectively applies a control voltage to the input terminal 20 through diode 22 for alternately biasing the power transistor 14 conductive and nonconductive. The protection circuit comprises a serially connected diode 24 and Zener diode 26 connected across the power transistor drain-to-gate circuit, and a resistor 28 connected across the power transistor gate-to-source circuit.

When the power transistor 14 is biased conductive by the control signal at input terminal 20, the diode 24 is reverse biased to block control signal loss through Zener diode 26 and the drain-to-source circuit of power transistor 14. However, when the control signal is removed to bias power transistor 14 nonconductive, the transient turnoff voltage (L * $di_L/dt$) forward biases diode 24 and exceeds the Zener voltage of Zener diode 26. In such case, Zener diode 26 conducts, and the voltage developed across resistor 28 maintains the power transistor 14 in a partially conductive state. This serves to limits the transient voltage $V_L$ by reducing the rate of change of current ($di_L/dt$) through the motor. Since the power transistor 14 is gated into conduction through a Zener effect, this technique is referred to herein as Zenered gating.

While the Zenered gating technique described above provides effective protection for the power transistor in most motor control applications, it is unacceptable in automotive applications due to the potential of load dump voltage transients. Load dump voltage transients may occur if the vehicle storage battery 10 is momentarily disconnected from the generator 16—at the battery connector posts, for example. The battery 10 represents a sizable load to the generator 16, and the term load dump means that the battery load is removed. If the electrical loads of the vehicle were still connected to the generator 16, they could be subjected to a relatively high generator voltage transient in the range of 40 to 60 volts. In such event, the Zener diode 26 of the protection circuit depicted in FIG. 1 could break down and cause the power transistor 14 to conduct, resulting in possible destruction of the power transistor due to overcurrent and excessive power dissipation.

Accordingly, the primary object of this invention is to provide an improved transistor protection circuit of the Zener gated type, which is not susceptible to source voltage transients due to load dumping.

This and other objects are carried forward with a protection circuit essentially including a protection transistor, a resistor, and a Zener diode. The emitter-collector circuit of the protection transistor is connected in series with the resistor across the primary conduction path of the power transistor, with the resistor connected across the conduction control terminals of the power transistor. The Zener diode is connected in series with the emitter-base circuit of the protection transistor across the motor, with the Zener diode poled to oppose current flow through the emitter-base circuit. Transient inductive voltage generated across the motor, upon removal of a externally applied conduction producing control signal exceeds the reverse breakdown threshold of the Zener diode and biases the protection transistor conductive. The protection transistor, in turn, directs current through the resistor to develop a bias voltage which biases the power transistor into a partially conductive state for slowly dissipating the inductive transient. Source voltage transients due to load dump equally affect the emitter and base terminals of the protection transistor, and are ineffective to bias the power transistor conductive.

IN THE DRAWINGS

Figure 1:
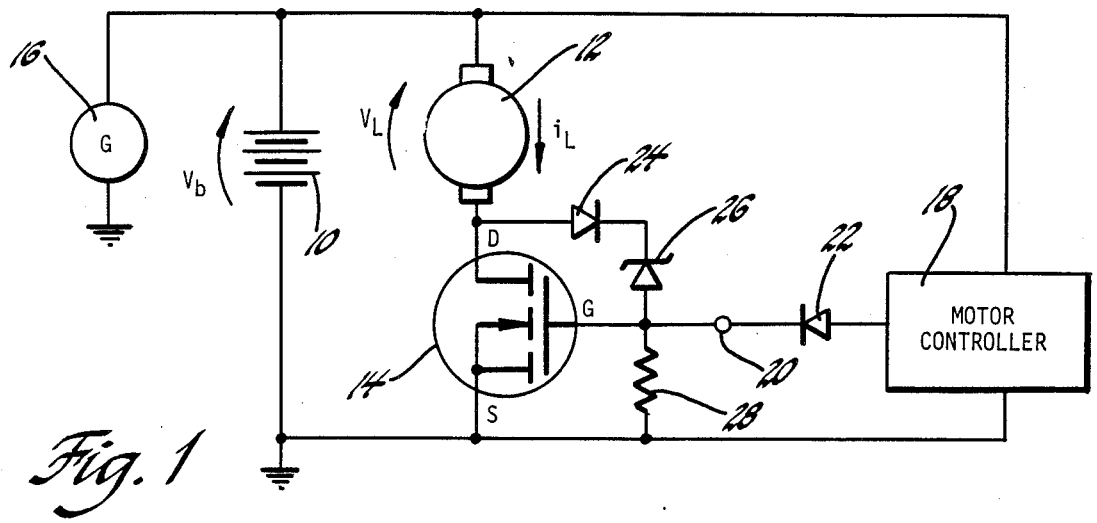
FIG. 1 is a circuit diagram of an automotive motor controller, including a transistor protection circuit of the Zener gated type.
Figure 2:
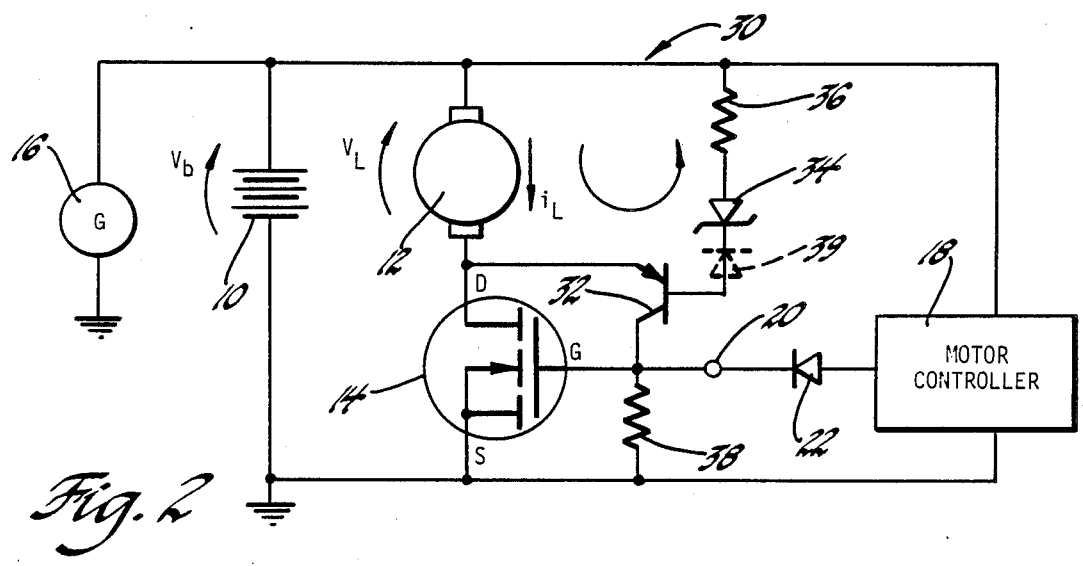
FIGS. 2-3 are circuit diagrams of an automotive motor controller, including protection circuits according to first and second embodiments of this invention.

FIG. 2 depicts an automotive motor control circuit with a low side switch configuration as described above in reference to FIG. 1. The term low side switch, as used herein, means that one side of the motor is connected to a relatively positive source voltage, and the power transistor is connected between the other side of the motor and the relatively negative source voltage. The circuit elements common to both Figures have been assigned the same reference numerals 10-22. Thus, the controller 18 applies an alternating voltage control signal to the input terminal 20 through diode 22 for alternately biasing the power transistor 14 conductive and nonconductive for energizing the motor 12 with the storage battery 10.

It is noted at the outset that while power transistor 14 has been depicted as an insulated-gate type field effect transistor, the protection circuit of this invention is equally applicable to motor control circuits utilizing a different type of power transistor such as a bipolar power transistor. In this regard, the drain-to-source circuit is sometimes referred to herein as the primary conduction circuit of the power transistor. Similarly, the gate and source terminals are sometimes referred to herein as the conduction control terminals of the power transistor.

A Zener gated protection circuit according to this invention is designated generally by the reference numeral 30. As explained below, the protection circuit 30 protects power transistor 14 from damage due to inductive voltage transients at turnoff of the power transistor, but is not susceptible to source voltage transients due to load dump conditions. The protection circuit 30 comprises a PNP protection transistor 32, a Zener diode 34, and a pair of resistors 36 and 38. The emitter-collector circuit of protection transistor 32 is connected in series with the resistor 38 across the primary conduction circuit of power transistor 14, the resistor 38 being connected across the power transistor conduction control terminals. The serial combination of Zener diode 34, resistor 36, and the base-emitter circuit of protection transistor 32 is connected across the motor 12, the Zener diode 34 being poled to oppose current flow in the base-emitter circuit.

When the controller 18 applies a control signal to the input terminal 20 to bias power transistor 14 conductive, the protection transistor 32 is reverse biased. If the emitter-to-base voltage differential under such conditions is sufficient to result in a destructive breakdown of the junction, an optional diode 39 may be placed in series with the Zener diode 34 and resistor 36 as shown.

When the controller 18 removes the bias, power transistor 14 begins to turn off, and an inductive voltage $V_L$ is generated across the motor 12 according to the relationship:

$$V_L = L * di_L/dt$$

where L represents the inductance of the motor windings, and $di_L/dt$ represents the rate of change in motor current $i_L$. Such voltage is negative in regard to the convention depicted in FIG. 2, and reverse biases the Zener diode 34. The power transistor turn off continues until the inductive voltage $V_L$ exceeds the battery voltage by the reverse breakdown, or Zener, voltage of Zener diode 34. At such time, the Zener diode 34 conducts, and current flows in a circuit comprising motor 12, the emitter-base circuit of transistor 32, Zener diode 34, resistor 36, and diode 39, if included. The resistor 36 operates during this condition to limit the emitter-base current through the protection transistor 32. The emitter-base current biases transistor 32 into conduction, and current flows in a second circuit comprising the storage battery 10, the motor 12, the emitter-collector circuit of protection transistor 32, and the resistor 38. The voltage across resistor 38 maintains the power transistor 14 in a state of partial conduction, which reduces the rate of change of current $di_L/dt$ through the motor 12, and limits the inductive voltage $V_L$ to a safe value.

As the voltage $V_L$ falls, the protection transistor 32 and the power transistor 14 become progressively less conductive. When the difference between the inductive voltage $V_L$ and the battery voltage $V_b$ falls below the reverse breakdown voltage of Zener diode 34, Zener diode 34 ceases to conduct, and the protection transistor 32 is biased nonconductive. As a result, the voltage across resistor 38 collapses, and the power transistor 14 is biased nonconductive.

Source voltage transients, as may occur in a load dump condition, equally affect the emitter and base of protection transistor 32, and are ineffective to bias it into conduction. Under such conditions, the power transistor 14 is safe so long as it is capable of sustaining the primary conduction circuit voltage transient differential.

Figure 3:
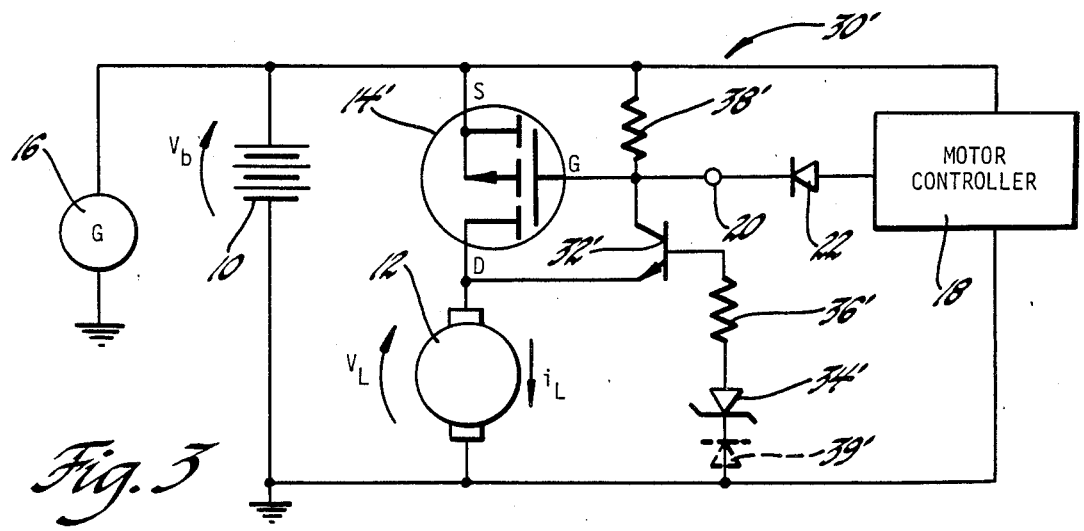

FIG. 3 depicts the protection circuit of this invention in connection with an automotive motor control circuit having a high side switch configuration. The term high side switch means that one side of the motor is connected to a relatively negative source voltage, and the power transistor is connected between the other side of the motor and the relatively positive source voltage. This generally requires that the power transistor be of the opposite conductivity type, as compared to the low side configuration.

The protection circuit for the high side configuration is analogous to the protection circuit depicted in FIG. 2 in connection with the low side configuration. The reference numerals designating circuit elements analogous to those of FIG. 2 have been retained and primed. Thus, the emitter-collector circuit of NPN protection transistor 32' is connected in series with the resistor 38' across the primary conduction circuit of power transistor 14', the resistor 38' being connected across the power transistor conduction control terminals. The serial combination of Zener diode 34', resistor 36', and the base-emitter circuit of protection transistor 32' is connected across the motor 12, the Zener diode 34' being poled to oppose current flow in the emitter-base circuit. As in FIG. 2, an optional diode 39' may be needed to prevent reverse conduction in the base-emitter circuit of protection transistor 32'.

Operationally, the protection circuit 30' is similar to the protection circuit 30 of FIG. 2. Accordingly, a detailed description of such operation is deemed to be unnecessary.

It should be understood that since this invention pertains to a protection circuit for a power transistor, the circuit elements common to FIGS. 1–3 are given by way of example, and are not to be considered limiting. In an alternate mechanization, for example, the motor controller 18 could take the form of a simple single-pole double-throw switch, alternately connecting the input terminal 20 to the positive and ground potentials defined by the storage battery 10. In such case, the controller 18 would provide both positive and negative bias to the power transistor 14/14', rendering diode 22 unnecessary. Also, the resistor 28/38/38' would be connected between the controller 18 and the gate of power transistor 14/14'—effectively across the power transistor conduction control terminals, at least when the controller 18 is biasing power transistor 14/14' nonconductive.

In addition to the various modifications described above, further modifications will occur to those skilled in the art, and it should be understood that protection circuits incorporating such modifications may fall within the scope of this invention, which is defined by the appended claims.

The embodiments of the invention in which an exclusive property or privilege is claimed are defined as follows:

1. In an automotive control circuit including a storage battery, and the serial combination of an electric motor and a power transistor connected across the battery, the power transistor being biasable to a conductive state in which current is supplied from the battery to the motor through the primary conduction circuit of the power transistor when a conduction producing control voltage is applied across its conduction control terminals, a protection circuit which protects the power transistor from damage due to the generation of transient inductive voltage across the motor when the conduction producing control voltage is removed from the conduction control terminals, the protection circuit comprising:

a protection transistor having an emitter-collector circuit connected in series with a resistor across the primary conduction circuit of the power transistor, the resistor being connected across the conduction control terminals of the power transistor, and a Zener diode connected in series with the emitter-base circuit of the protection transistor across the motor, the Zener diode being poled to oppose current flow through such emitter-base circuit, such that when a transient inductive voltage is generated across the motor upon removal of the control voltage, the reverse breakdown voltage of the Zener diode is exceeded and the protection transistor is biased conductive to permit current flow in a circuit comprising the battery, the motor, the emitter-collector circuit of the protection transistor, and the resistor, thereby to generate a voltage across the resistor which biases the power transistor to a partially conductive state for reducing the rate of decrease in current through the motor and the magnitude of the resulting transient inductive voltage.

2. A protection circuit as set forth in claim 1, wherein the storage battery defines relatively positive and relatively negative potentials, one side of the motor is connected to the relatively positive potential, the other side of the motor is connected to the relatively negative potential through the primary conduction circuit of the power transistor, and the protection transistor is of the PNP type.

3. A protection circuit as set forth in claim 1, wherein the storage battery defines relatively positive and relatively negative potentials, one side of the motor is connected to the relatively negative potential, the other side of the motor is connected to the relatively positive potential through the primary conduction circuit of the power transistor, and the protection transistor is of the NPN type.

4. A protection circuit as set forth in claim 1, including a current limit resistor in series with the Zener diode for limiting the current in the emitter-base circuit of the protection transistor.

* * * * *